(12) United States Patent
Diamond (10) Patent No.: US 12,087,462 B1
(45) Date of Patent: Sep. 10, 2024

(54) RADIOPAQUE PARTICLE PROCESSING ADDITIVE

(71) Applicant: Honeywell Federal Manufacturing & Technologies, LLC, Kansas City, MO (US)

(72) Inventor: Louis Diamond, Kansas City, MO (US)

(73) Assignee: Honeywell Federal Manufacturing & Technologies, LLC, Kanasa City, MO (US)

( * ) Notice: Subject to any disclaimer, the term of this patent is extended or adjusted under 35 U.S.C. 154(b) by 0 days.

(21) Appl. No.: 18/654,715

(22) Filed: May 3, 2024

(51) Int. Cl.
*G21F 3/00* (2006.01)

(52) U.S. Cl.
CPC ....................... *G21F 3/00* (2013.01)

(58) Field of Classification Search
CPC .................... G21F 3/00; G21F 1/106
See application file for complete search history.

(56) References Cited

U.S. PATENT DOCUMENTS

| | | | | |
|---|---|---|---|---|
| 5,015,863 | A | * | 5/1991 | Takeshima ................ G21F 5/10 250/506.1 |
| 8,852,689 | B2 | | 10/2014 | Srinivas et al. |
| 2006/0222860 | A1 | | 10/2006 | Basheer et al. |

FOREIGN PATENT DOCUMENTS

| | | |
|---|---|---|
| EP | 3065178 A1 | 9/2016 |
| EP | 4047644 A1 | 8/2022 |
| JP | 2000131249 | 5/2000 |

* cited by examiner

*Primary Examiner* — Sean M Luck
(74) *Attorney, Agent, or Firm* — Erise IP, P.A.

(57) ABSTRACT

A radiopaque processing medium comprising a plurality of radiopaque particles and a non-radiopaque processing medium. The plurality of radiopaque particles is added to the non-radiopaque processing medium to increase a bulk density of the processing medium thereby forming the radiopaque processing medium. The radiopaque processing medium allows excess process media to be located and characterized during X-ray inspection of an electronic device on which the radiopaque processing medium was used. The radiopaque processing medium may also be used to locate and identify flaws/defects of the electronic device based on the location of excess radiopaque processing medium. The radiopaque processing medium may also be used as an underfill material to reinforce electronic chips soldered to the electronic device.

20 Claims, 5 Drawing Sheets

RADIOPAQUE PARTICLE PROCESSING ADDITIVE

STATEMENT OF GOVERNMENT SUPPORT

This invention was made with government support under Contract No.: DE-NA-0002839 awarded by the United States Department of Energy/National Nuclear Security Administration. The government has certain rights in the invention.

BACKGROUND

1. Field

Embodiments of the present disclosure relate to processing media additives in electronics manufacturing. Specifically, embodiments of the present disclosure relate to processing media additives for increasing bulk-density of processing media for electronics manufacturing, among other applications.

2. Related Art

Traditionally, electronics manufacturing utilizes X-ray inspection to verify features obscured from line of site. X-ray inspection is used to reveal blind features (e.g., solder joints hidden under components) that are not visible during manual visual inspection (MVI). Difficulties present in X-ray inspection include computed tomography (CT) artifacts present in the X-ray image, for example, physics-based artifacts such as photon starvation and beam hardening, and patient-based artifacts such as presence of metal. Further, relatively high voltages may be used to penetrate assemblies with high-metal content. However, higher intensity radiation penetrates low density media, such as flux, without sufficient contrast. Accordingly, it may be difficult to inspect relatively low density materials, such as flux or other process media, through CT imaging.

Frequently, electronics manufacturing uses flux as a process media in conjunction with soldering processes. Flux serves the purpose of cleaning and removing oxides and impurities from metal surfaces, thereby enhancing the wetting and bonding of solder to the components. The development of no-clean fluxes has gained prominence in recent years, offering reduced environmental impact and the elimination of post-soldering residue. In addition to traditional soldering, techniques such as solder paste, a combination of solder granules and flux, and underfill materials have also emerged to cater to specific electronic device assembly requirements.

The above-mentioned processing media, flux in particular, is not visible directly using X-ray tomography. As such, cleaning electronic devices, whether by hand or by machine, is difficult due to the lack of identification of excess process media. As such, cleaning and inspecting electronic devices during manufacturing can be an inefficient, and in some cases, ineffective process due to the lack of knowledge surrounding the location and quantity of excess process media, particularly in reference to blind features of an electronic device (e.g., features entirely obfuscated from view by other components or by the processing media itself).

SUMMARY

Embodiments of the present disclosure solve the above-mentioned problems by providing systems and methods for applying radiopaque particles as contrast media during X-ray inspection, cleaning, and quality control of electronic devices such as printed circuit boards (PCBs).

In some aspects, the techniques described herein relate to a processing medium additive for quality control of process media, the processing medium additive including a plurality of radiopaque particles configured to be dispersed into the process media, each of the plurality of radiopaque particles including a radiopaque core configured to block electromagnetic radiation, and at least one insulating coating disposed over the radiopaque core, the at least one insulating coating configured to prevent electrical arcing, and wherein the plurality of radiopaque particles increases a bulk density of the process media such that the process media is visible via radiographic imaging.

In some aspects, the techniques described herein relate to a system for increasing X-ray inspection detectability of at least a portion of an electronic device, the system including a processing medium configured to be applied to the electronic device, a plurality of radiopaque particles dispersed into the processing medium, each radiopaque particle of the plurality of radiopaque particles including a high-density core configured to block electromagnetic radiation, and one or more insulating layers disposed over the high-density core that provide electrical shielding and prevent electrical arcing.

In some aspects, the techniques described herein relate to a method of increasing an X-ray inspection detectability of a processing medium, the method including forming a processing medium additive including a plurality of radiopaque particles, each radiopaque particle of the plurality of radiopaque particles including a high-density radiopaque core configured to block electromagnetic radiation, and a nonconductive layer disposed external to the high-density radiopaque core, the nonconductive layer configured to decrease an electrical conductivity of the processing medium additive, dispersing the processing medium additive into the processing medium such that the plurality of radiopaque particles is homogenously dispersed into the processing medium, wherein the processing medium additive is configured to block electromagnetic radiation to thereby increase an X-ray inspection detectability of the processing medium.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

BRIEF DESCRIPTION OF THE DRAWING FIGURES

Embodiments of the present disclosure are described in detail below with reference to the attached drawing figures, wherein.

The drawing figures do not limit the present disclosure to the specific embodiments disclosed and described herein. The drawings are not necessarily to scale, emphasis instead being placed upon clearly illustrating the principles of the present disclosure.

DETAILED DESCRIPTION

The subject matter of the present disclosure is described in detail below to meet statutory requirements; however, the description itself is not intended to limit the scope of claims. Rather, the claimed subject matter might be embodied in other ways to include different steps or combinations of steps similar to the ones described in this document, in conjunction with other present or future technologies. Minor variations from the description below will be understood by one skilled in the art and are intended to be captured within the scope of the present disclosure. Terms should not be interpreted as implying any particular ordering of various steps described unless the order of individual steps is explicitly described.

The following detailed description references the accompanying drawings that illustrate specific embodiments in which the present disclosure can be practiced. The embodiments are intended to describe aspects of the present disclosure in sufficient detail to enable those skilled in the art to practice the present disclosure. Other embodiments can be utilized and changes can be made without departing from the scope of the present disclosure. The following detailed description is, therefore, not to be taken in a limiting sense. The scope of the present disclosure is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Embodiments of the present disclosure are generally directed to a processing medium additive for electronics manufacturing that allows excess and improperly placed processing media to be detected during X-ray inspection of the electronic device. The additive may comprise a plurality of radiopaque particles having one or more coating layers. The coating layers may include a non-stick layer to prevent adhesion between the radiopaque particles and a secondary material, a binding layer to adhere the radiopaque particles to the non-stick layer or to particles of the processing media, and/or an interstitial layer for binding to other components. The coating layers may also include one or more layers of material configured to alter the properties of the radiopaque particles and therefore the processing media the radiopaque particles are added to.

Radiopaque Particles

Figure 1A:
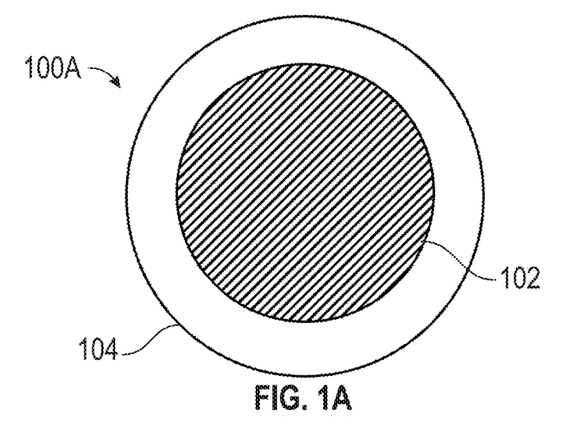
FIG. 1A illustrates an exemplary radiopaque particle having a core and an insulating layer relating to some embodiments.

Referring to FIG. 1A, an exemplary radiopaque particle 100A is illustrated. Radiopaque particle 100 comprises a radiopaque core 102. In some embodiments, core 102 comprises a metal compound having a high density (e.g., at or above 11.33 g/cm$^3$). In some embodiments, the core 102 comprises a relatively high-density particle with an atomic number of 72 or above. Some high-density metals include gold, tantalum, platinum, lead, or any other such metal or metal compound having a density at or around 11.33 g/cm$^3$. The metal may also be selected based on the adhesive properties of the metal. For example, a metal with a high-surface area (i.e., optimal for adhesion) may be selected to aid in adhesion of one or more coating layers.

In some embodiments, the radiopaque particle 100 comprises a globule consisting of at least two layers such as a core layer configured to provide contrast and an insulating layer disposed over the core layer and, in some cases over one or more other layers configured to prevent arcing. In some embodiments, additional layers may be disposed between the core and the outer insulating layer to tailor for specific material properties. For example, an adhesion layer consisting of titanium or chromium may be added to increase a bond strength between adjacent layers. In some embodiments, other materials suitable for thin film adhesion may be used as a bonding/adhesion layer. As another example, corrosion inhibitor layers such as nickel or gold may be used to prevent degradation associated with corrosion and/or other surface degradation mechanisms. Further, in some embodiments, a composite ceramic insulating layer such as, for example, silicon nitride and/or boron nitride, may be added to alleviate stress within the thin film while maintaining sufficient insulation of the core. Further still, composite ceramic and epoxy layer may be added such that an epoxy material fills cracks and/or pores within the ceramic material resulting from stress fractures. As yet another example, of an additional layer, a binding agent layer may be added to prevent clumping with other globules while adhering to a process medium to ensure even distribution of the globules onto the process medium. In some embodiments, any combination of the above-mentioned additional layers described herein may be used. For example, both of an adhesion layer and a corrosion inhibitor layer may be added.

Radiopaque particle 100 may further comprise one or more coating layers. For example, radiopaque particle 100A includes an insulating layer 104. The insulating layer 104 comprises a nonconductive electrically insulating material. In some embodiments, the insulating layer 104 is configured to prevent electrical arcing and electrical shorts of the radiopaque core 102.

Figure 1B:
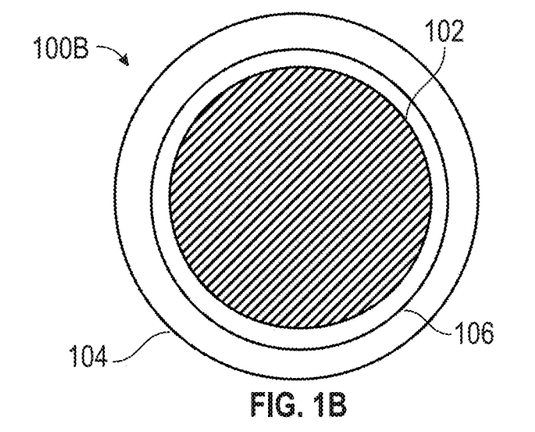
FIG. 1B illustrates an exemplary radiopaque particle having a core, an insulating layer, and an adhesion layer relating to some embodiments.

Referring to FIG. 1B, an exemplary radiopaque particle 100B is illustrated. The radiopaque particle 100B includes the radiopaque core 102 and insulating layer 104, as described above. Additionally, the radiopaque particle 100B includes an adhesion layer 106. The adhesion layer 106 may be configured to facilitate a contact interface between the core 102 and the insulating layer 104. For example, the adhesion layer 106 may be disposed external to the core 102 but internal to the insulating layer 104 to bind the insulating layer 104 to the core 102.

Adhesion layer 106 may be configured to bind directly to core 102. Adhesion layer 106 is configured to bond core 102 to a secondary material such as a material of the insulating layer 104 or another outer layer. Adhesion layer 106 may bond core 102 to secondary materials. For example, the adhesion layer 106 may comprise an interstitial metal layer such as titanium or chromium, configured to bond adjacent layer similar to a thin film manufacturing technique. Alternatively, in some embodiments, the adhesion layer 106 may bond layers through a thermoset epoxy interstitial that alleviates stress and backfill fissures within an adjacent ceramic layer. The insulating layer 104 may be applied to adhesion layer 106 and secured using the metallic adhesive compounds included within the adhesion layer 106. In some embodiments, the adhesive constituents of the adhesion layer 106 may be selected based on the materials of the core 102 and the insulating layer 104. For example, an adhesive compound that binds with both the core material and the outer layer material may be selected.

As described above, radiopaque particle 100 comprises a high-density core 102. Core 102 may comprise any radiopaque compound. Particularly, core 102 may comprise radiopaque metals or metal compounds comprising metals such as gold, platinum, tantalum, lead, or any other such metal/metal compound that is radiopaque. In some embodiments, core 102 comprises a nonmetal radiopaque compound with a high density. The density of core 102 may, at least in part, determine the radiopacity of core 102. For example, as the density of core 102 increases, so does the radiopacity of core 102.

Core 102 is configured to block electromagnetic radiation from passing through the respective radiopaque particle 100. For example, X-ray radiation (a small band of the electromagnetic spectrum spanning $3 \times 10^{19}$ to $3 \times 10^{16}$ Hz) is blocked by core 102 such that core 102, and therefore radiopaque particle 100, appears on an image produced by X-ray tomography. It is contemplated that core 102 may block any range of the electromagnetic spectrum. Additionally, in some embodiments, the radiopaque particles 100 may be placed on an outer surface of one or more electronic components to shield, hide, and/or obfuscate the electronic components from X-ray imaging, for example, to prevent reverse engineering of the electronic components.

In some embodiments, binding the core 102 to a secondary substance may be beneficial. For example, core 102 may be bound to processing medium 124 (as depicted in FIG. 1E). Insulating layer 104 may be a ceramic layer such as silicon nitride ($Si_3N_4$), boron nitride (BN), hafnium carbide (HfC), tantalum carbide (TaC), niobium carbide (NbC), zirconium carbide (ZrC), hafnium nitride (HfN), hafnium boride ($HfB_2$), zirconium boride ($ZrB_2$), titanium boride ($TiB_2$), titanium carbide (TiC), niobium boride ($NbB_2$), tantalum boride ($TaB_2$), titanium nitride (TiN), zirconium nitride (ZrN), silicon carbide (SiC), vanadium carbide (VC), tantalum nitride (TaN), niobium nitride (NbN), vanadium nitride (VN), or any other such ceramic material. In some embodiments, the insulating layer 104 comprises a ceramic material with a high-dielectric strength, such as silicon, boron, or aluminum nitride, as well as silicon nitride where a relatively thin layer of dielectric material is suitable. For example, silicon nitride may be used as a dielectric layer for particles within the nano-range.

Figure 2:
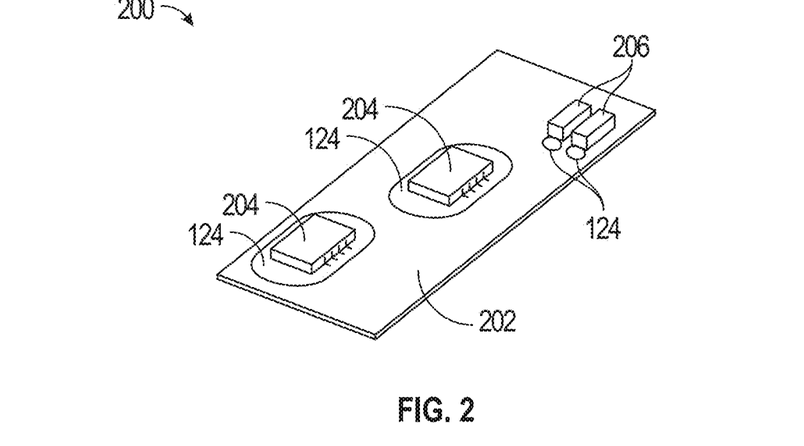
FIG. 2 illustrates a printed circuit board (PCB) and electronic components with a processing medium in place as an underfill, an obfuscation material, and a solder material for some embodiments.

Insulating layer 104 may be configured to be dielectric. For example, insulating layer 104 may comprise silicon nitride, a dielectric material. Insulating layer 104 may be dielectric to prevent shorts on an electronic printed circuit board (PCB) as depicted in FIG. 2. The dielectric properties of insulating layer 104 are beneficial when processing medium 124 is flux, solder, solder paste, or any other such processing medium that conducts electricity. For example, if the processing medium 124 is solder flux, then excess solder flux containing only core 102 is electrically conductive, thereby introducing the possibility of shorts between electrical contacts on a PCB. As such, a dielectric layer between processing medium 124 and core 102 is introduced to prevent electrical shorting between core 102 and electrical contacts on a PCB or electronic device. The dielectric layer is disposed external to the radiopaque core 102. For example, the dielectric insulating layer 104 may be bonded to the core 102 via interstitial adhesion layer 106. Alternatively, embodiments are contemplated in which the adhesion layer 106 is not included. For example, depending on the materials of the core 102 and the insulating layer 104 (or other layers) the adhesion layer 106 may not be needed and the layers may be configured to bind directly to one another without any interstitial layer or adhesive.

Dielectric insulation of insulating layers is used to mitigate risk of electrical shorts between electrical contacts. In some embodiments, a thickness of the nonconductive, insulating layer 104 is selected to prevent electrical arcing. Accordingly, in some embodiments, silicon nitride material may be used for the insulating layer 104 to prevent electrical arcing for relatively smaller particles, such as nanoparticles. However, the thickness limitations of silicon nitride may not be adequate for preventing arcing in larger particles, such as in the microparticle range or larger. Accordingly, other materials or additional layers may be used to prevent arcing in larger particles.

Figure 1C:
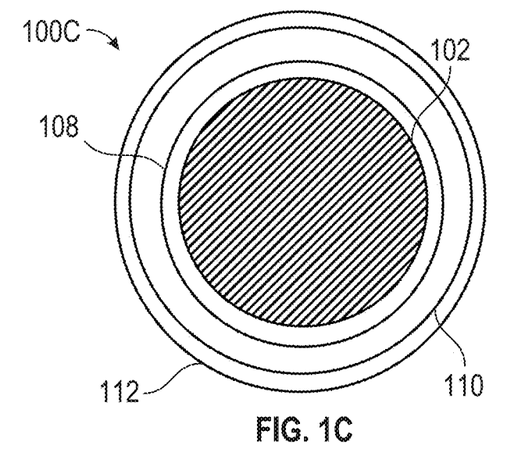
FIG. 1C illustrates an exemplary radiopaque particle having a plurality of layers relating to some embodiments.

Referring now to FIG. 1C, an exemplary radiopaque particle 100C is illustrated relating to some embodiments. The radiopaque particle 100C includes the core 102, as described above. Additionally, the exemplary radiopaque particle 100C includes a plurality of layers, such as a first layer 108, a second layer 110, and a third layer 112, as shown. In some embodiments, any number of additional layers are included.

The first layer 108 may be applied directly to the core 102, as shown. Alternatively, in some embodiments, the first layer 108 may be applied to the adhesion layer 106, as described above, such that the adhesion layer 106 acts as an interstitial layer between the core 102 and the first layer 108. In some embodiments, the first layer 108 includes a ceramic material. The first layer 108 may include a ceramic material with a relatively low stress resistance and relatively effective dielectric properties, such as, for example, silicon nitride which has relatively high dielectric strength but low stress tolerance that limits film thickness.

The second layer 110 may be applied directly over the first layer 108, as shown. Alternatively, in some embodiments, yet another binding adhesion layer may be disposed therebetween to bind the first layer 108 and second layer 110. The second layer 110 may also include a ceramic material. However, embodiments are contemplated in which the second layer 110 includes a second ceramic material that is distinct from the ceramic material of the first layer 108. For example, the second ceramic material may have a relatively higher stress resistance and relatively less effective dielectric properties compared to the ceramic material of the first layer 108.

Alternatively, embodiments are contemplated in which the second layer 110 includes a polymer material. For example, the second layer 110 may include a polymer with a relatively high temperature and caustic resistance. Further, the polymer material may be configured to fill cracks within the ceramic material of the first layer (as well as any other ceramic layers). In some embodiments, the second layer 110 provides backing and support for the first layer 108.

In some embodiments, the third layer 112 includes a ceramic material. For example, the third layer 112 may include the same ceramic material as the first layer 108. Embodiments are contemplated in which any number of alternating material layers is included. For example, a plurality of layers may be included with each layer alternating between a first ceramic material and a second ceramic material. Some ceramic materials may include thickness limits for which the materials cannot be applied beyond a particular thickness. Accordingly, alternating layers may be repeated to achieve a greater thickness. Alternatively, or additionally, the plurality of layers may alternate between a ceramic material and a polymer material. In some embodiments, the number of alternating layers in the plurality of layers is selected to achieve a particular dielectric property of the radiopaque particles 100.

In some embodiments, the plurality of alternating layers may be configured to provide a particular electrical resistance and/or thermal resistance for the core 102. Alternating layers may comprise a ceramic material providing resistance to thermal environments (e.g., environments having a temperature at or above 300° C.). It is contemplated that alternating layers may provide thermal resistance at any temperature without departing from the scope of the present disclosure. Further, in some embodiments, alternating layers may provide corrosion resistance such that caustic, thermal, and agitated environments do not penetrate the layers and corrode or damage the core 102.

Figure 1D:
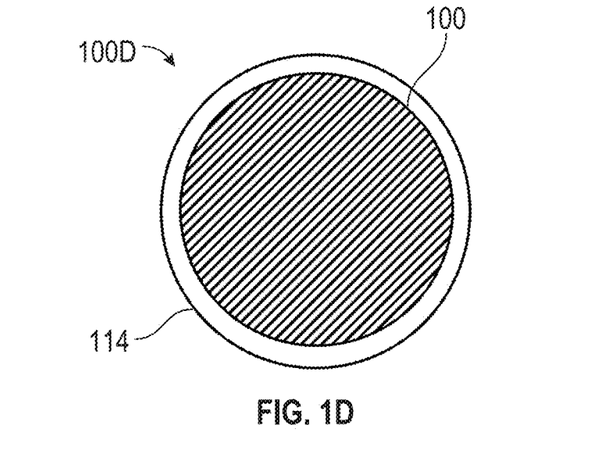
FIG. 1D illustrates an exemplary radiopaque particle having an outer layer relating to some embodiments.
Figure 1E:
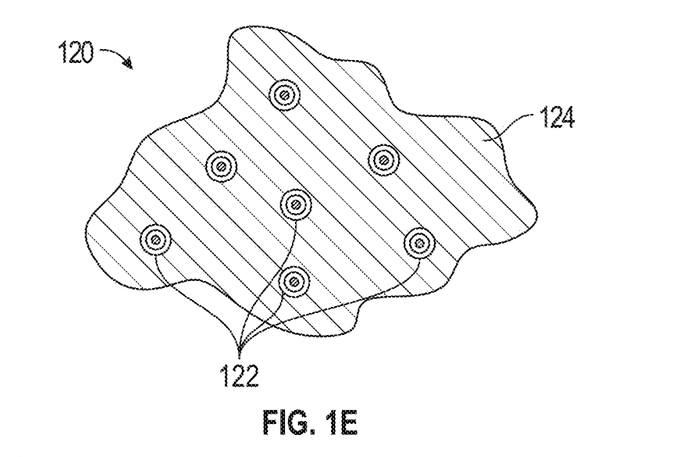
FIG. 1E plurality of radiopaque particles suspended in a processing medium for some embodiments.

Referring now to FIG. 1D, yet another exemplary radiopaque particle 100D is illustrated relating to some embodiments. The radiopaque particle 100 may comprise an outer coating layer 114, as shown. Coating layer 114 may serve a multitude of a different purposes. For example, coating layer 114 may provide a non-stick exterior of radiopaque particle 100 to prevent radiopaque particle 100 from adhering to other radiopaque particles 100. In some embodiments, coating layer 114 may be an interstitial layer configured to provide an interstitial boundary between radiopaque particle 100 and a secondary material such as processing medium 124. For example, the coating layer may comprise an interface coating configured to provide a contact interface with the processing medium 124. Further, in some embodiments, the non-stick exterior layer of the radiopaque particles 100 may be configured to prevent the radiopaque particles 100 from adhering to a secondary material and/or a tertiary material. In some embodiments, the outer coating layer 114 is disposed around any of the above mentioned radiopaque particles described above such as any of 100A, 100B, or 100C.

In some embodiments, coating layer 114 is configured to provide non-stick properties between radiopaque particle 100 and other materials such as processing media (as depicted in FIG. 1E) or any other material. In some embodiments, coating layer 114 may be configured to prevent radiopaque particle 100 from binding to other radiopaque particles. For example, in some embodiments, a plurality of radiopaque particles 100 are included and it may be problematic for the plurality of radiopaque particles 100 to adhere together and form larger particles or clumps. As such, an outer layer may be effective in preventing the plurality of radiopaque particles 100 from adhering to each other. Additionally, or alternatively, in some embodiments, the coating layer 114 may comprise a nonconductive coating configured to further decrease the electrical conductivity of the radiopaque particles 100. For example, the coating layer 114 may include silica or another nonconductive material configured to reduce electrical conductivity or otherwise insulate the core 102. Alternatively, in some embodiments, the nonconductive coating may be included on one or more internal layers of the radiopaque particles 100. For example, a separate nonconductive coating may be included internal to the coating layer 114.

In some embodiments, a material of the coating layer 114 is selected based on a desired relation (i.e., hydrophilic, hydrophobic, chemical bonding, or chemical resistance, etc.) to the media or environment of the radiopaque particles 100. It should be understood that the coating layer 114, as described herein, may be applied external to any of the layers described above. For example, in some embodiments, the coating layer 114 may be applied over the insulating layer 104, the third layer 112, or the adhesion layer 106, as well as other additional layers not explicitly described herein.

In some embodiments, the coating layer 114 is configured to act as a binding agent between a medium and the radiopaque particle 100. For example, the coating layer 114 may provide a non-stick effect between other radiopaque particles but improve adhesion to the medium. Alternatively, in some embodiments, where desirable, the coating layer 114 may be configured to additionally provide adhesion between particles.

In some embodiments, one or more layers of the radiopaque particles 100 may be configured to alter, either directly or indirectly, the properties of processing media 124. For example, one or more layers, and therefore radiopaque particle 100, may be configured to increase the viscosity of processing media 124 to reduce flow during melting. In some embodiments, one or more layers are configured to provide an abrasive surface to radiopaque particle 100 to aid in preparing a surface for being soldered. The abrasive surface may improve the cleaning and preparing functionality of flux material during soldering by increasing surface area available for solder to fill.

In some embodiments, the radiopaque particle 100 comprises a nanoparticle within the nano-size range, i.e., having a physical dimension less than 100 nanometers, for example, a diameter of less than 100 nanometers. Alternatively, in some embodiments, the radiopaque particle 100 comprises a microparticle with a physical dimension between approximately 1 and 1000 micrometers. Alternatively, in some embodiments, other types and sizes of particles are contemplated. Further, embodiments are contemplated in which a plurality of radiopaque particles are included with a variety of different sizes. In some embodiments, at least one radiopaque particle of the plurality of radiopaque particles has a diameter of less than 100 micrometers.

FIG. 1E illustrates a portion 120 of an exemplary electronic device comprising a processing medium 124 and a processing medium additive such as a plurality of radiopaque particles 122. As described above, processing medium 124 contains plurality of radiopaque particles 122 which increase the bulk density of processing medium 124, thereby forming processing medium 124. In some embodiments, processing medium 124 comprises any number of additional elements. For example, processing medium 124 may comprise thinners, solvents, stabilizers, acids, cleaners, and/or any other such chemical or any combination thereof. In some embodiments, the plurality of radiopaque particles 122 is dispersed into the processing medium 124. For example, the plurality of radiopaque particles 122 is dispersed homogenously into the processing medium 124 using any of a variety of suitable dispersion and mixing techniques. Additionally, in some embodiments, each of the radiopaque particles 122 comprises an external coating layer or interface layer configured to bind the respective radiopaque particles 122 to the processing medium 124. For example, the external binding layer may include an external binding agent that binds to a surface of the processing medium 124.

In some embodiments, the processing medium additive (e.g., the plurality of radiopaque particles 122) is selectively removable from the processing medium 124. For example, embodiments are contemplated in which the plurality of radiopaque particles 122 are configured to be removed using an aqueous solution. Alternatively, in some embodiments, the processing medium 124 itself may be removed via a suitable cleaning technique. For example, processing medium 124 may be removed using any suitable cleaning solution such as an aqueous or alcohol-based cleaning solution.

In some embodiments, each of the plurality of radiopaque particles 122 correspond to radiopaque particle 100. In some embodiments, each of the plurality of radiopaque particles 122 is an instance of the radiopaque particle 100, as described above. For example, a portion of plurality of radiopaque particles 122 have layers 104 and 106, a separate portion of radiopaque particles 122 have only layer 104, and another separate portion of radiopaque particles 122 has layers 104, 106, and 108-112. In some embodiments, each of radiopaque particles 122 are identical and serve a uniform purpose such as increasing the bulk density of processing medium 124 for increasing radiopacity of processing medium 124. As such, the bulk density of the process media is increased by inclusion of the radiopaque particles 122 such that the process media is visible via X-ray inspection and other radiographic imaging techniques.

FIG. 2 illustrates an exemplary electronic device 302 comprising a printed circuit board (PCB) 202. In some embodiments, the electronic device 302 comprises one or more electronic components, such as, for example, one or more electronic chips 204 and one or more resistors 206, as shown. The processing medium 124 may be applied to the circuit board 202 and/or the one or more electronic components. In some embodiments, the plurality of radiopaque particles 122 within the processing medium 124 is configured to protect the one or more components of the electronic device 302 from electrical current spikes.

In-Situ Inspection During Manufacturing

Figure 3:
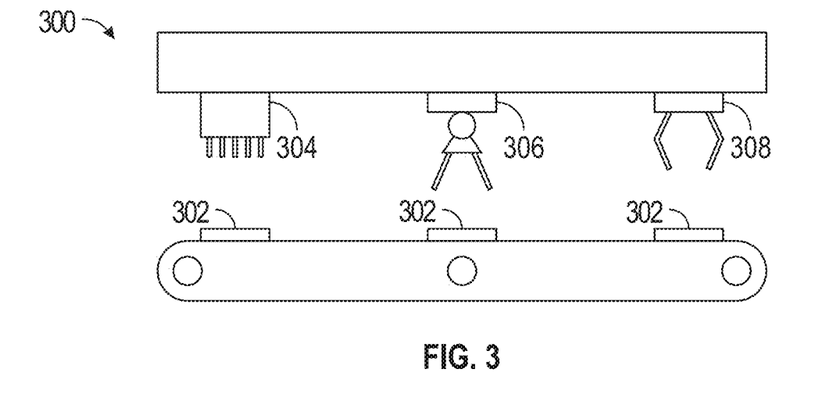
FIG. 3 illustrates an assembly line comprising a soldering station, an X-ray inspection station, and a accept/reject station for some embodiments.

Referring to FIG. 3, an assembly line for manufacturing electronic devices using radiopaque processing medium 124 is illustrated for some embodiments. assembly line 300 may comprise a series of stations including a soldering station 304, an X-ray inspection station 306, and/or an accept/reject station 308 or any combination thereof. In some embodiments, the assembly may comprise any number of stations and machines, unique or identical, such as pick-and-place machines, wave solder machines, photo-inspection machines, manual assembly stations, packaging stations, and/or any other such assembly machine, or any combination thereof.

The assembly line may move a plurality of electronic devices 302 through the assembly line until they have been accepted or rejected. For example, assembly line 300, or at least a portion thereof, may begin at station 304 where electronic chip 204 is soldered to PCB 202 using processing medium 124 thereby forming, at least in part, electronic device 302. Electronic device 302 may then be moved to X-ray inspection station 306 where electronic device 302 undergoes X-ray tomography. The location and thickness of processing medium 124 is determined based on the X-ray tomography of electronic device 302 which reveals the location of processing medium 124 by identifying and locating radiopaque particles 122 present in locations radiopaque particles 122 are not intended to be.

The assembly line may then move electronic device 302 to accept/reject station 308. In some embodiments, accept/reject station 308 is incorporated into X-ray inspection station 306. Accept/reject station 308 may accept or reject electronic device 302 based on the X-ray tomography performed at station 306. For example, an electronic device 302 receives X-ray tomography which determines the location of excess process media and identifies flaws/defects in electronic device 302. If there are flaws/defects in electronic device 302 that will not be remedied by the cleaning process then electronic device 302 will be rejected and may be removed from the assembly line to be destroyed or reassembled.

Process of Cleaning

Figure 4:
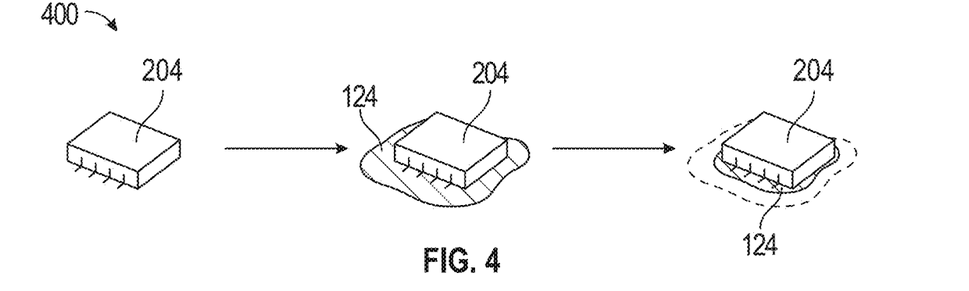
FIG. 4 illustrates a process of applying a processing medium containing radiopaque particles to an electronic chip and cleaning excess processing medium after X-ray inspection for some embodiments.

Referring to FIG. 4, a process 400 for cleaning excess process media 124 from an electronic chip 204 is illustrated. As depicted in illustration 4A, process 400 may begin with electronic chip 204 on PCB 202. Electronic chip 204 may then be soldered to PCB 202 using processing media 124, as depicted in illustration 4B. Soldering electronic chip 204 to PCB 202 may leave excess processing media 124 around the proper contact points between electronic chip 204 and PCB 202. Excess amounts of process media 124 is undesirable. Particularly when the excess amounts of process media 124 bridges contact points between pins of electronic chip 204 or between ground and any particular pin of electronic chip 204.

Radiopaque particles 100 may be added to processing media 124. For example, Radiopaque particles 100 are uniformly mixed with processing media 124, such as solder, flux, solder paste, and/or underfill material or any other such processing media, prior to the soldering process. Radiopaque particles 100 increase the bulk density of processing media 124, resulting in enhanced radiopacity of processing media 124. The incorporation of radiopaque particles 100 eliminates the need for post-assembly inspection of electronic devices, as excess processing media 124 can now be located and assessed during in-line X-ray inspection.

When electronic chip 204 is soldered to PCB 202 using radiopaque particles 100, any excess processing media 124 that bridges contact points between pins or between ground and any particular pin of electronic chip 204 becomes clearly discernible during X-ray tomography. Real-time inspection and detection of excess processing media 124 is enabled, preventing potential electrical or mechanical issues by revealing blind features of processing media 124 during X-ray inspection. In-line, real-time X-ray inspection of PCB 202 after soldering, increases reliability of electronic device 302 by decreasing the number of electronic devices 302 that complete the manufacturing and quality control process with defects present.

The introduction of radiopaque particles 100 into radiopaque particles 100 not only facilitates real-time quality control but also aids in the subsequent cleaning process. Once excess processing media 124 has been identified through X-ray tomography, precise localization of the undesired material is possible using radiopaque particles 100. The targeted cleaning process ensures that electronic devices 302, maintain optimal and reliable connections, reducing the likelihood of defects and failures, and ultimately enhancing their performance and longevity.

Method of Cleaning/Inspecting

Figure 5:
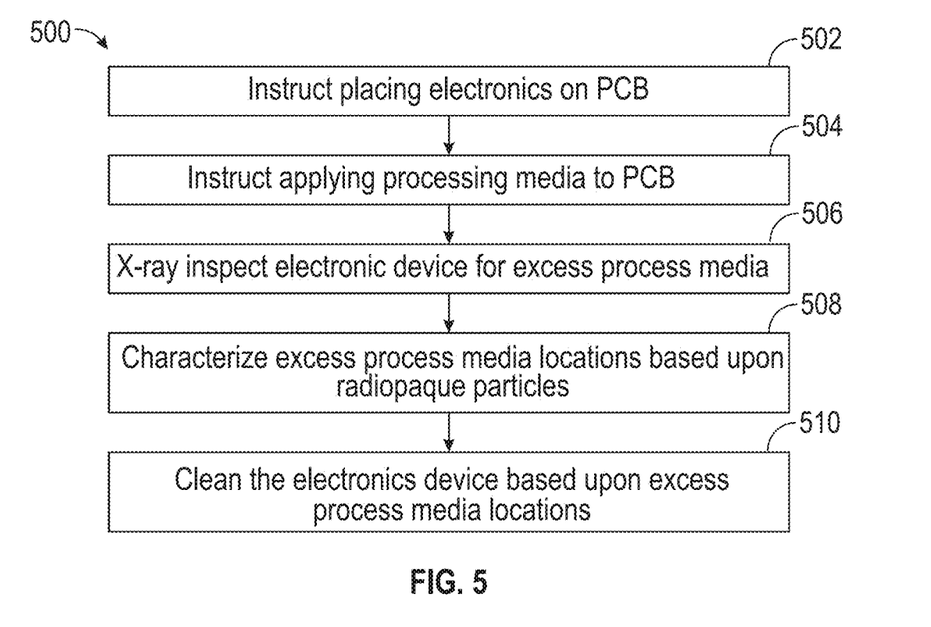
FIG. 5 illustrates a method of instructing cleaning and inspection of an electronic device using a processing medium containing radiopaque particles for some embodiments.

Referring to FIG. 5, a method 500 for instructing cleaning and inspecting an electronic device using a processing medium containing radiopaque particles is illustrated for some embodiments. The method may comprise one or more of the following steps in any order. It is contemplated that method 500 may comprise any number of additional steps not disclosed herein, without departing from the scope of the present disclosure.

Method 500 may comprise step 502 directed to instructing placing electronic components (e.g., chip 204, resistor 206, or any other such electronic component) on PCB 202. Each electronic component may be placed by a pick-and-place/surface-mount-technology (SMT) machine. In some embodiments, step 502 is performed by a machine and/or a worker. In some embodiments, step 502 is absent and method 500 begins with the electronic components already in place.

Method 500 may comprise step 504 directed to instructing applying processing medium 124 containing a plurality of radiopaque particles 100 to PCB 202. In some embodiments, processing medium 124 is the flux component of solder. If processing medium 124 is a component of solder and/or solder paste then method 500 may comprise an additional step for heating and melting the solder. For example, once solder is present, it must be heated in order to become the contact points between the electronic devices and PCB 202.

Method 500 may comprise step 506 directed to instructing X-ray inspection of PCB 202 for excess process media. In some embodiments, step 506 comprises using X-ray tomography to reveal blind features of PCB 202 and the components placed thereon such that any portion of process media 124 that is out of place may be identified. In some embodiments, step 506 comprises exposing PCB 202 to X-ray radiation and obtaining an image or representation of the results of the X-ray inspection.

Method 500 may comprise step 508 directed to characterizing locations of the excess process media 124 based on the radiopaque particles 100. Determining the locations of radiopaque particles 100 is achieved by examining, by eye or by computer implemented algorithm, the X-ray information retrieved from the X-ray inspection. The locations of the excess process media 124 can be determined by examining the results of X-ray inspection looking for the radio-signature of radiopaque particles 100. Any location where radiopaque particles 100 are located outside of their intended locations is where excess process media 124 is located. Therefore, by characterizing the locations of the radiopaque particles 100 the location of excess process media 124 can also be characterized.

In some embodiments, step 508 includes determining a number of necessary cleaning passes to remove excess process media 124. For example, based upon the relative radiopacity of process media 124 (caused by radiopaque particles 100) the thickness of excess process media 124 may be determined. Furthermore, the area of excess process media 124 may be determined during X-ray inspection. Thus, the volume of excess process media 124 may be determined and thereby the number of necessary cleaning passes to remove the process media.

Method 500 may comprise step 510 directed to cleaning the electronic device based upon the characterized locations of excess process media 124. Based on the characterized locations of excess process media 124 determined in step 508, PCB 202 can be cleaned using any sort of cleaning method. (e.g., weak organic acid, hard-bristle brushes, pressurized water, solvents, or any other such cleaning method). Step 510 may be performed multiple times in order to remove the correct amount of process media 124. In some embodiments, any of a number of suitable cleaning solutions may be used such as any combination of alcohol-based, as well as aqueous solutions may be applied to clean the processing media and/or to remove the processing medium additive.

In some embodiments, step 510 may be performed a number of times based on the number of necessary cleaning passes determined in step 508. For example, step 508 may determine that 5 cleaning passes are needed to successfully remove excess process media 124. As such, step 510 is performed 5 times and excess process media 124 is removed entirely.

Method of Determining Flawed Electronic Devices

Figure 6:
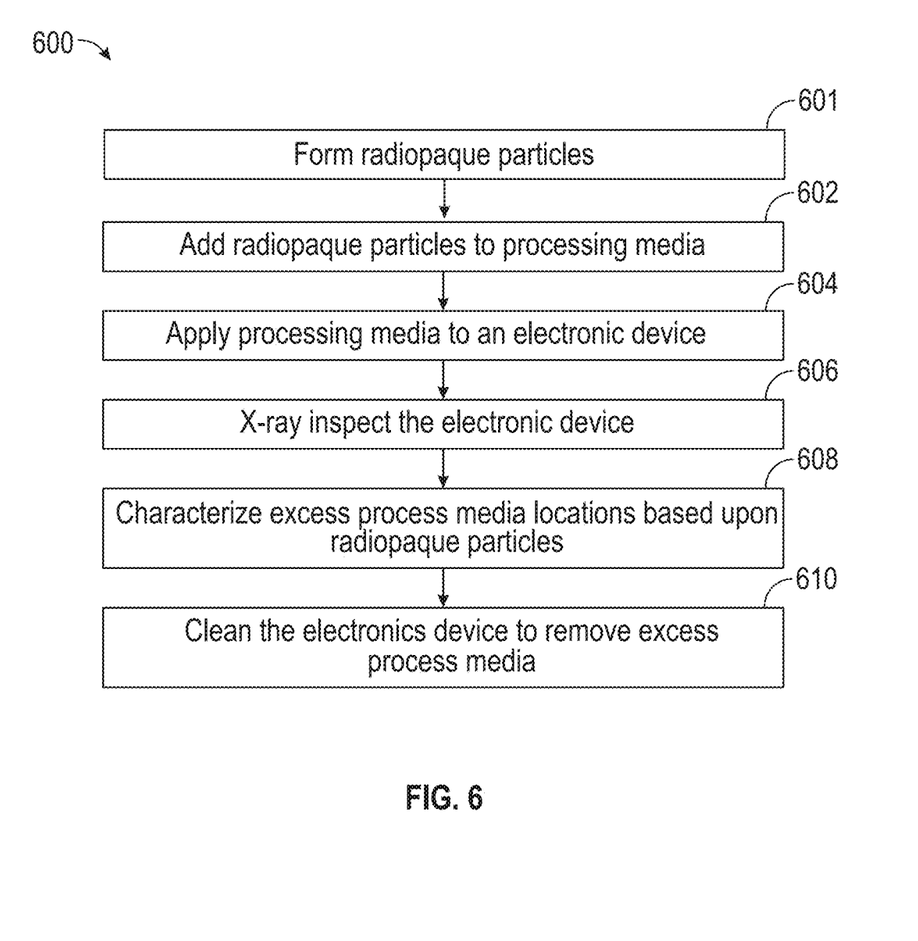
FIG. 6 illustrates an alternate method of instructing cleaning and inspection of electronics of an electronic device using a processing medium containing radiopaque particles for some embodiments.

FIG. 6 illustrates a method 600 of determining flawed PCBs 202 based on the location and shape of process media 124 containing radiopaque particles 100. For example, method 600 may comprise a plurality of steps directed to adding radiopaque particles 100 to a processing medium 124, applying processing medium 124 to a preassembled electronic device 302, X-ray inspecting the preassembled electronic device 302, determining the location of excess process media 124, determine the number of cleaning passes necessary based on the locations of excess process media 124, and cleaning the electronic device 302 based on the locations and number of cleaning passes needed.

At step 601, a plurality of radiopaque particles is formed. In some embodiments, the radiopaque particles are formed by coating various layers over high density core particles. For example, each radiopaque particle may comprise a high-density radiopaque core coated with an insulating layer and any number of additional layers. In some embodiments, the layers including the insulating layer and any additional layers are applied using a suitable deposition technique, such as, for example, a chemical vapor deposition technique such as fluidized bed chemical vapor deposition.

Method 600 may comprise step 602 which includes adding radiopaque particles 100 into processing medium 124. This involves uniformly mixing radiopaque particles 100 with processing medium 124, which may consist of solder, flux, solder paste, and/or underfill material. The introduction of radiopaque particles 100 increases the bulk density of the processing medium 124, thus enhancing its radiopacity.

Further, method 600 comprises step 604 directed to the application of the prepared processing medium 124, now containing radiopaque particles 100, to a preassembled electronic device 302. During step 604, processing medium 124 is applied to the appropriate areas of the electronic device 302, ensuring secure connections and proper assembly. The uniform distribution of radiopaque particles 100 within the processing medium 124 allows the location of excess process media to be detected by ensuring that all portions of process media 124 contain at least one radiopaque particle 100.

Method 600 may comprise step 606 directed to X-ray inspection of electronic device 302. Step 606 allows for the identification and visualization of the location of excess processing medium 124. By analyzing the radiopacity of the processing medium 124 containing radiopaque particles 100, any discrepancies or excesses can be detected with precision. As such, the location of the excess process media 124 may be used to characterize the process media 124. For example, excess process media 124 may be characterized by its location and radiopacity to determine the number of cleaning passes needed to remove excess process media 124.

Method 600 may comprise step 608 directed to the determination of the specific locations where excess process media 124 is present on the electronic device 302. Step 608 relies on X-ray inspection results to pinpoint the exact areas that require cleaning. In some embodiments, an additional step may be included to calculate the number of cleaning passes necessary, based on the identified locations of excess process media 124 and the characterization of the process media 124.

Method 600 may comprise step 610 directed to cleaning electronic device 302 to remove excess process media 124 based on the location of excess process media 124 and the number of cleaning passes required. Cleaning the excess process media 124 based on the location and number of cleaning passes needed ensures that the electronic device 302 is free from excess process media 124, resulting in reliable and defect-free PCBs 202.

In some embodiments, an additional step may be included for disposing the processing media over an external surface of at least one electronic component of the electronic device 302 to thereby shield the at least one electronic component from X-ray detection.

It is contemplated that method 600 may not include any portion of the steps described above without departing from the scope of the present disclosure. In some embodiments, method 600 comprises additional steps such as placing electronic chip 204 on electronic device 302, characterize process media thickness based upon a relative radiopacity value when compared to a known radiopacity value and thickness of processing medium 124, cleaning electronic device 302 based on the locations of excess processing medium 124, and/or any other such step or any combination thereof. Additionally, embodiments are contemplated in which the steps described herein may be altered or performed in a different order. For example, in some embodiments, the radiopaque particles 122 are applied directly to the electronic device 302 after the processing medium 124 is already secured to the electronic device 302.

Figure 7:
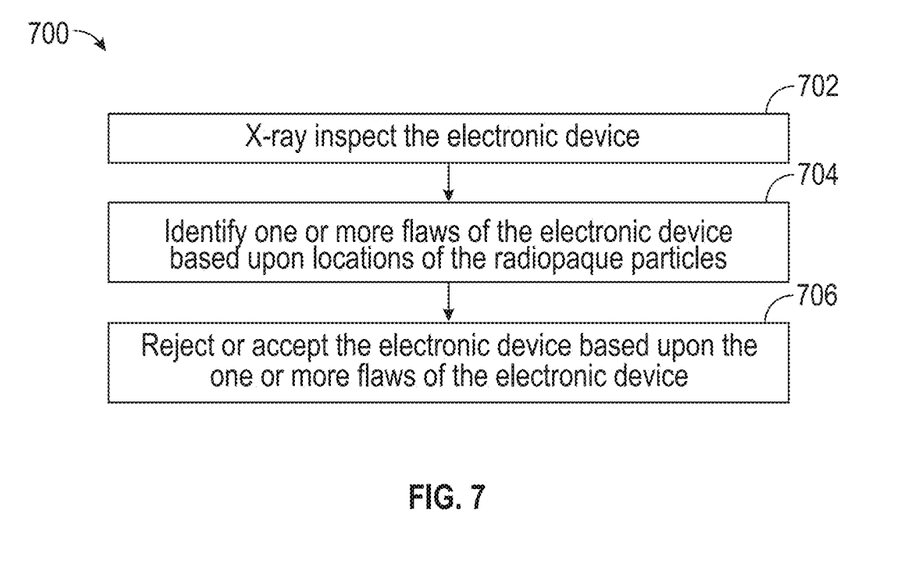
FIG. 7 illustrates a method of evaluating an electronic device using a processing medium containing radiopaque particles for some embodiments.

FIG. 7 illustrates an exemplary method 700 of evaluating electronic device 302 relating to some embodiments of the present disclosure. In some embodiments, the method 700 may be performed after at least a portion or simultaneously with method 600, as described above. For example, the method 700 may be performed after the processing media is applied to the electronic device 302 at step 604.

At step 702, the electronic device 302 is inspected using X-ray inspection techniques. For example, step 702 may include transmitting X-ray signals into the electronic device 302 using any form of suitable x-ray device.

At step 704, one or more flaws of the electronic device 302 are identified based upon locations of the identified radiopaque particles. For example, in some embodiments, the one or more flaws may be identified based on the frequency of radiopaque particles present within a particular portion of the electronic device 302. Further, in some embodiments, the processing medium additive is configured to increase contrast between the processing medium and the electronic device 302. Further, the plurality of radiopaque particles 122 may be configured to increase contrast associated with one or more defects of the electronic device 302.

At step 706, the electronic device 302 is either accepted or rejected based at least in part on the one or more flaws identified in step 704. In some embodiments, the electronic device 302 may be accepted based further in part on an acceptability score determined based on the one or more identified flaws. For example, the number of flaws (and/or the type of flaws) may be used to determine the acceptability score and the electronic device may be rejected if the acceptability score does not exceed a predetermined acceptability threshold. Further, in some embodiments, additional steps for repairing or re-fabricating the electronic device 302 may be performed after and in response to rejection of the electronic device 302.

In some embodiments, the method 700 may be repeated for a plurality of electronic devices 302. For example, embodiments are contemplated in which a plurality of electronic devices are fabricated on an assembly line system and an X-ray inspection device is included inline within the assembly line system such that the plurality of electronic devices may be inspected serially as each device passes through the assembly line. Alternatively, or additionally, in some embodiments, a plurality of electronic devices may be inspected and evaluated simultaneously.

Figure 8:
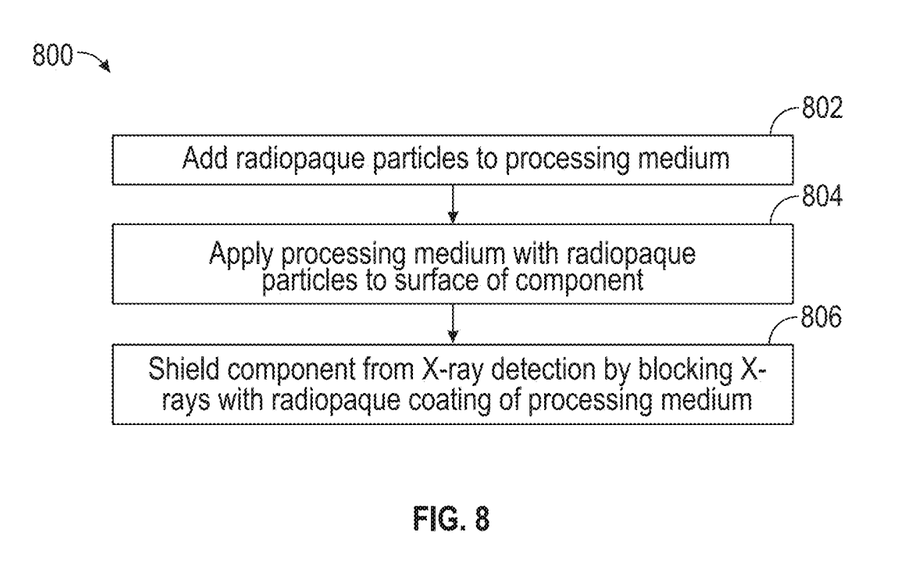
FIG. 8 illustrates a method of providing an X-ray shielding coating to a component for some embodiments.

FIG. 8 illustrates a method 800 of providing an X-ray shielding coating to a component for some embodiments. In some embodiments, the method 800 provides an X-ray shielding coating to a component, such as an electronic component or device, to obfuscate the component from X-ray detection. For example, the X-ray shielding coating may be applied to one or more outer surfaces of the component to prevent X-ray detection such that only the outer radiopaque coating is visible via X-ray and the component cannot be viewed.

At step 802, radiopaque particles are added to the processing medium. In some embodiments, the radiopaque particles are added to the processing medium in a similar means as described above with respect to step 602. The processing medium may comprise any form of processing medium described herein such as any of solder, flux, solder paste, an underfill material, an epoxy, a curable resin, or another material configured to adhere to a surface of the component.

At step 804, the processing medium with the added radiopaque particles is applied to one or more surfaces of the component. In some embodiments, the processing medium may be applied to the entire outer surface of the component to prevent X-ray detection from any angle. Alternatively, in some embodiments, the processing medium may only be applied to one or more exposed surfaces of the component that would be viewable via X-ray.

At step 806, the component is shielded or otherwise obfuscated from X-ray detection by presence of the radiopaque particles within the processing medium blocking X-rays. In some embodiments, a concentration of the radiopaque particles within the processing medium may be selected to achieve a particular level of X-ray blocking such that the component is not visible under the processing medium. Accordingly, in some embodiments, the concentration of radiopaque particles for X-ray shielding may be greater than the concentration for X-ray inspection such that no X-rays or very few X-rays are able to pass through the processing medium. As such, the component may be entirely shielded or substantially blurred when viewed by an X-ray imaging device.

In some embodiments, the processing medium may be bonded to the component such that removal of the processing medium destroys at least a portion of the component such that the processing medium cannot be removed to view the component via X-ray. In some embodiments, the processing medium with radiopaque particles is applied to an entire device. For example, the processing medium may be applied over an outer surface of an electronic device to prevent X-ray detection of one or more components within the electronic device.

Although the present disclosure has been described with reference to the embodiments illustrated in the attached drawing figures, it is noted that equivalents may be employed and substitutions made herein without departing from the scope of the present disclosure as recited in the claims.

Having thus described various embodiments of the present disclosure, what is claimed as new and desired to be protected by Letters Patent includes the following:

1. A processing medium additive for quality control of process media, the processing medium additive comprising:
   a plurality of radiopaque particles configured to be dispersed into the process media, each of the plurality of radiopaque particles comprising:
      a radiopaque core configured to block electromagnetic radiation; and
      at least one insulating coating disposed over the radiopaque core, the at least one insulating coating configured to prevent electrical arcing; and
   wherein the plurality of radiopaque particles increases a bulk density of the process media such that the process media is visible via radiographic imaging.

2. The processing medium additive of claim 1, wherein the radiopaque core provides electromagnetic shielding to one or more components of an electronic device.

3. The processing medium additive of claim 1, wherein each of the plurality of radiopaque particles further comprises:
   an external binding agent for binding the respective radiopaque particle to the process media.

4. The processing medium additive of claim 3, wherein the at least one insulating coating comprises a nonconductive ceramic coating.

5. The processing medium additive of claim 1, wherein the processing medium additive is configured to be removed using a cleaning solution.

6. The processing medium additive of claim 1, wherein the radiopaque core comprises a particle with an atomic number of 72 or above.

7. The processing medium additive of claim 1, further comprising:
   a plurality of additional layers disposed external to the radiopaque core, the plurality of additional layers comprising one or more distinct alternating material layers.

8. A system for increasing X-ray inspection detectability of at least a portion of an electronic device, the system comprising:
   a processing medium configured to be applied to the electronic device;
   a plurality of radiopaque particles dispersed into the processing medium, each radiopaque particle of the plurality of radiopaque particles comprising:
      a high-density core configured to block electromagnetic radiation; and
      one or more insulating layers disposed over the high-density core that provide electrical shielding and prevent electrical arcing.

9. The system of claim 8, wherein each radiopaque particle further comprises:
   an adhesion layer disposed between the high-density core and the one or more insulating layers, the adhesion layer configured to adhere the one or more insulating layers to the high-density core.

10. The system of claim 8, wherein the processing medium is solder flux or solder paste.

11. The system of claim 8, wherein at least one radiopaque particle of the plurality of radiopaque particles has a diameter of less than 100 micrometers.

12. The system of claim 8 wherein the plurality of radiopaque particles is configured to obfuscate one or more components of the electronic device from view.

13. The system of claim 8, wherein each radiopaque particle of the plurality of radiopaque particles comprises:
   a non-stick outer coating layer disposed external to the one or more insulating layers, the non-stick outer coating layer configured to prevent clumping between the plurality of radiopaque particles.

14. The system of claim 8, wherein the one or more insulating layers comprises:
   a first layer comprising a first nonconductive material disposed external to the high-density core;
   a second layer comprising a second nonconductive material disposed external to the first layer, the second nonconductive material distinct from the first nonconductive material; and
   a third layer comprising the first nonconductive material disposed external to the second layer.

15. The system of claim 14, wherein the first nonconductive material comprises a stress-resistant, dielectric ceramic material, and the second nonconductive material comprises a temperature-resistant polymer material configured to fill cracks within the first nonconductive material.

16. A method of increasing an X-ray inspection detectability of a processing medium, the method comprising:
   forming a processing medium additive comprising a plurality of radiopaque particles, each radiopaque particle of the plurality of radiopaque particles comprising:
      a high-density radiopaque core configured to block electromagnetic radiation; and
      a nonconductive layer disposed external to the high-density radiopaque core, the nonconductive layer configured to decrease an electrical conductivity of the processing medium additive;
   dispersing the processing medium additive into the processing medium such that the plurality of radiopaque particles is homogenously dispersed into the processing medium,
   wherein the processing medium additive is configured to block electromagnetic radiation to thereby increase an X-ray inspection detectability of the processing medium.

17. The method of claim 16, wherein the processing medium is configured to be applied to an electronic device.

18. The method of claim 17, wherein the processing medium additive is configured to increase contrast between the processing medium and the electronic device.

19. The method of claim 16, further comprising:
disposing an adhesion layer between the high-density radiopaque core and the nonconductive layer, the adhesion layer configured to bind the nonconductive layer to the high-density radiopaque core and the nonconductive layer.

20. The method of claim 19, further comprising:
disposing the processing medium over an external surface of at least one electronic component of an electronic device to thereby shield the at least one electronic component from X-ray detection.

* * * * *

UNITED STATES PATENT AND TRADEMARK OFFICE
CERTIFICATE OF CORRECTION

| | | |
|---|---|---|
| PATENT NO. | : 12,087,462 B1 | Page 1 of 1 |
| APPLICATION NO. | : 18/654715 | |
| DATED | : September 10, 2024 | |
| INVENTOR(S) | : Louis Diamond | |

It is certified that error appears in the above-identified patent and that said Letters Patent is hereby corrected as shown below:

On the Title Page

Item (73) should read as follows:
Honeywell Federal Manufacturing & Technologies, LLC, Kansas City, MO (US)

Signed and Sealed this
Eighth Day of October, 2024

Katherine Kelly Vidal
*Director of the United States Patent and Trademark Office*